United States Patent [19]
Bradford

[11] Patent Number: 5,485,393
[45] Date of Patent: Jan. 16, 1996

[54] METHOD AND APPARATUS FOR MEASURING ELECTRICAL PARAMETERS USING A DIFFERENTIATING CURRENT SENSOR AND A DIGITAL INTEGRATOR

[75] Inventor: Curtis V. Bradford, Campbell, Calif.

[73] Assignee: Metricom, Inc., Los Gatos, Calif.

[21] Appl. No.: 97,816

[22] Filed: Jul. 27, 1993

Related U.S. Application Data

[63] Continuation-in-part of Ser. No. 887,116, May 20, 1992, Pat. No. 5,243,536, which is a continuation of Ser. No. 575,000, Aug. 30, 1990, abandoned.

[51] Int. Cl.$^6$ ............................ G01R 21/06; G06F 19/00
[52] U.S. Cl. .................... 364/483; 364/572; 364/724.01; 324/142
[58] Field of Search ...................................... 364/483, 492, 364/724.01, 572, 574; 324/142; 341/118, 143; 323/205, 212

[56] References Cited

U.S. PATENT DOCUMENTS

| | | | |
|---|---|---|---|
| 4,106,093 | 8/1978 | Grimm et al. | 364/572 |
| 4,595,988 | 6/1986 | Chiffert et al. | 364/483 |
| 4,672,555 | 6/1987 | Hart et al. | 364/483 |
| 4,746,899 | 5/1988 | Swanson et al. | 364/724.01 |
| 4,795,974 | 1/1989 | Landman et al. | 324/142 |
| 4,811,236 | 3/1989 | Brennen et al. | 364/483 |
| 4,884,021 | 11/1989 | Hammond et al. | 364/483 |
| 4,945,359 | 7/1990 | Yamakido | 341/143 |
| 4,979,122 | 12/1990 | Davis et al. | 364/492 |
| 4,987,416 | 1/1991 | Leslie | 341/118 |
| 4,999,627 | 3/1991 | Agazzi | 341/143 |
| 5,128,611 | 7/1992 | Konrad | 364/483 |
| 5,243,536 | 9/1993 | Bradford | 364/483 |
| 5,301,121 | 4/1994 | Graverick et al. | 364/483 |
| 5,311,117 | 5/1994 | Komatsu et al. | 364/483 |

FOREIGN PATENT DOCUMENTS 2-75966  3/1990  Japan .
2127992  4/1984  United Kingdom .

OTHER PUBLICATIONS

Lopez, R. A., et al., "Reactive Power Meter for Nonsinusoidal Systems", *IEEE Trans. Instrum. Meas.*, vol. IM–26, pp. 258–260 (Sep. 1977).

Krajewski, R. A., "A Formal Aspect of the Definition of Power", *Measurement*, vol. 8, No. II (Apr.–Jun. 1990).

Czarnecki, L., "One–Ports Which Realize the Hilbert Transformation and Their Application in Reactive Power Meters for Nonsinusoidal Systems", *Archiwum Elektrotechniki*, vol. 33, No. 3–4 (Poland, 1984).

Handbook for Electricity Metering published by Edison Electric Institute (8th Ed.) Chapter 9, pp. 173–196 (first Ed. 1912 latest Ed. 1981).

Oppenheim, et al., "Digital Signal Processing", (Prentice–Hall, 1975), p. 360.

*Primary Examiner*—Emanuel T. Voeltz
*Assistant Examiner*—Eric W. Stamber
*Attorney, Agent, or Firm*—Townsend and Townsend and Crew; Philip H. Albert

[57] ABSTRACT

A digital current meter, usable either alone or in combination with a voltage meter, is disclosed. The current meter includes a current sensor which outputs the time derivative of the current flowing through the load being measured. The differentiated current signal is digitally sampled, usually by a sigma-delta sampler, filtered, and digitally integrated. A feedback path is provided to remove the direct-current (DC) component of the current signal, to keep the integrator from going out of range. A bleeder feedback channel around the digital integrator is provided to keep the digital integrator from permanently latching an impulse. In combination with a voltage meter, a half-sample delay is introduced in the current signal path, to compensate for the lead provided by the combination of the analog differentiator and the digital integrator, and the voltage signal path uses filters with the same characteristics as the current channel, to match the delay in the two channels.

20 Claims, 16 Drawing Sheets

FIG. 1 POWER METER APPLICATION FOR MEASURING A THREE-PHASE LOAD

FIG. 2 POWER METER CIRCUIT

FIG. 3    CURRENT CHANNEL PROCESSOR

FIG. 4  VOLTAGE CHANNEL PROCESSOR

FIG. 5 SECOND-ORDER DELTA-SIGMA MODULATOR

FIG. 6   THIRD ORDER DECIMATING SINC FILTER

FIG. 7   FIRST ORDER DECIMATING SINC FILTER

FIG. 8   DIGITAL DELTA-SIGMA MODULATOR

FIG. 9    SECOND ORDER SINC FILTER

FIG. 10 LOW FREQUENCY FIRST ORDER DECIMATION SINC FILTER

FIG. 11  DIGITAL PHASE DELAY

FIG. 12  ALTERNATE EMBODIMENT OF DIGITAL PHASE DELAY 60

FIG. 13 GAIN OF SINC FILTERS W/O COMPENSATION

METHOD AND APPARATUS FOR MEASURING ELECTRICAL PARAMETERS USING A DIFFERENTIATING CURRENT SENSOR AND A DIGITAL INTEGRATOR

RELATED APPLICATION INFORMATION

This application is a continuation-in-part of application Ser. No. 07/887,116, filed May 20, 1992, now issued as U.S. Pat. No. 5,243,536 on Sep. 9, 1993, which is a file wrapper continuation of application Ser. No. 07/575,000, filed Aug. 30, 1990, now abandoned.

BACKGROUND OF THE INVENTION

This invention relates to a power meter for accurately measuring voltage across and current through a load using a voltage sensor and a differentiating current sensor, i.e. a current sensor which outputs a signal representing the derivative with respect to time of the current measured.

U.S. Patent No. 5,243,536, co-owned with the present application, teaches how to use a voltage sensor which outputs a v(t) signal and a current sensor which outputs an i(t) signal to provide a measurement of voltage, volt$^2$-hours (an integration of v$^2$(t) over time), current, amp$^2$-hours (an integration of i$^2$(t) over time), watts (v(t)×i(t)), VAR-hours (volt-amps reactive—(quadrature v(t))×i(t)), and similar quantities related to electrical parameters of the load. The term v(t) is, at various times, referred to as the voltage as a function of time, the instantaneous voltage at time t, or the voltage waveform, while the term i(t) is referred to as the current as a function of time, the instantaneous current at time t, or the current waveform. Herein, the derivative of i(t), shown as d[I(t)]/dt or just di/dt, refers to the time derivative of the current signal, also known as the differentiation of the current signal. For clarity, the analog functions are referred to herein as signals, and the digitized versions of these signals are referred to herein as sample streams, or waveforms.

Each of these parameters can be derived from v(t) and/or i(t). In the apparatus shown in U.S. Pat. No. 5,243,536, these two signals are converted to digital sample streams, which are then manipulated by digital circuits to find the desired electrical parameters, such as instantaneous power, average power, or total energy (usually measured in watt-hours or kilowatt-hours) consumed by the load.

The accurate measurement of these parameters finds many applications, one of which is in the field of utility service metering, where the load under measurement might be a residence, business, or factory. In the design of power meters, accuracy and cost are important. If errors in the readings of the v(t) and i(t) signals result in too high a reading, customers will object, and if the errors result in too low a reading, the utility will lose revenue. A utility meter must also be inexpensive, because the utility must provide at least one meter to each of their customers.

The voltage signal v(t) is sometimes measured using an operational amplifier (op-amp), possibly with the addition of a resistive divider network spanning two points of the load, while the current signal i(t) is sometimes measured by placing a small resistor in line with a conductor carrying the current. The voltage developed across the small resistor would then provide a voltage proportional to the current in the load. After multiplying by a suitable factor, i(t) is derived from this voltage.

Several problems arise with using a resistor to measure the current. In large loads, the power loss through the resistor is significant. Also, the resistor's temperature coefficient will cause its resistance to vary over temperature, thus causing variations in the measured i(t) signal for a steady current. These problems can be avoided through the use of a differentiating current sensor, which provides a differentiated current signal, d[i(t)]/dt, instead of i(t).

A differentiating current sensor might be provided by an inductive coil magnetically coupled to a conductor carrying the current to be measured. Since the voltage induced in an inductor is L×(di/dt), the inductor provides the differentiated current signal as a voltage, which is integrated to find i(t). Differentiating current sensors introduce a new set of problems however, in that the di/dt signal must be integrated. Even if the manipulation of v(t) and i(t) is performed digitally, the integration of i(t) is typically done with analog circuits because the stability of an analog integrator has been more easy to achieve than the stability of a digital integrator. However, an analog integrator requires analog components: at least one resistor and one capacitor per current channel, and these analog components have values which are temperature dependent and which drift over time. Using stable analog components is costly, and even then it does not remove all the temperature and time dependence.

A digital integrator creates several difficulties, however. One problem is the introduction of a phase shift of slightly less than −90° which does not totally compensate for the phase shift of exactly 90° caused by the differentiation done by the current sensor. This synchronization of the current and voltage signals is important, so that v(t) and i(t) values for a given t are easily multiplied when calculating power values. An analog integrator does not have this problem, since the phase shift of an analog integrator can be made to be exactly −90°. Of course, the difference between the phase shift of an analog integrator and a digital integrator is reduced as the sampling rate of the integrator increases, but it is never zero for finite sampling rates.

Therefore, what is needed is a current measuring device which can measure the current and output i(t) without a phase shift relative to v(t), and still do it inexpensively and with a minimum of temperature dependence.

SUMMARY OF THE INVENTION

According to the invention, a current meter, either alone or in combination with a voltage meter, measures current through a load in an electrical system using a current sensor, a digital sampler, digital filtering, and a digital integrator. The current sensor outputs a signal which is the differentiation (i.e., derivative with respect to time) of the current through the load, so the output of the digital integrator is the instantaneous current. So that the digital integrator does not overload by integrating the DC component of the current signal, a DC cancellation feedback path is provided, and an impulse bleeder path is provided around the integrator.

When combined with a voltage meter, a half-sample delay is introduced in the current signal path, to compensate for the fact that the digital integrator introduces a phase lag of −90° less a half sample; the relative phase delay of the differentiating current sensor, the integrator, and the half sample delay is then exactly 0°. The voltage signal path uses filters with the same characteristics as the current channel, to keep the relative delay in the two channels at 0°. Each channel also uses an IIR filter to compensate for the roll-off of sinc filters in the channel as well as for the amplitude characteristics of the digital integrator, which are slightly higher than an ideal integrator. The compensation of the IIR filter flattens the overall channel response due to the sinc filters, up to about fifteen times a fundamental frequency. The IIR transfer function is not equal to the inverse of the sinc filters' transfer functions, but is off by about half the curvature of the digital integrator, so that identical IIR filters can be used in both channels and still the remaining curvature in the channel transfer functions will largely cancel out when voltage and current are multiplied together.

In one power meter according to the present invention, the voltage channel and the current channel output a stream of instantaneous voltage and current measurements at an output sample rate. These samples are then processed to generate various electrical parameters, such as the average or instantaneous voltage, voltage squared, current, current squared, power, or reactive power (volt-amps reactive), as well as integrations of these quantities over a number of samples. In some embodiments of the power meter, a digital Hilbert transform filter is used to provide a phase shift in one of the voltage or current channels for accurate measurement of reactive power.

The sampling rate and the period of sampling determine the bandwidth and accuracy of the sampling technique. The invention can be implemented using a digital computer with suitable software or in suitable hardware components capable of manipulating the signal of interest.

One advantage to using a digital integrator in low-cost power meters is that a digital integrator does not add to the unit cost of the meter when it is implemented in an already existing digital signal processor.

The invention will be better understood by reference to the following detailed description in connection with the accompanying drawings.

DESCRIPTION OF THE PREFERRED EMBODIMENTS

Figure 1:
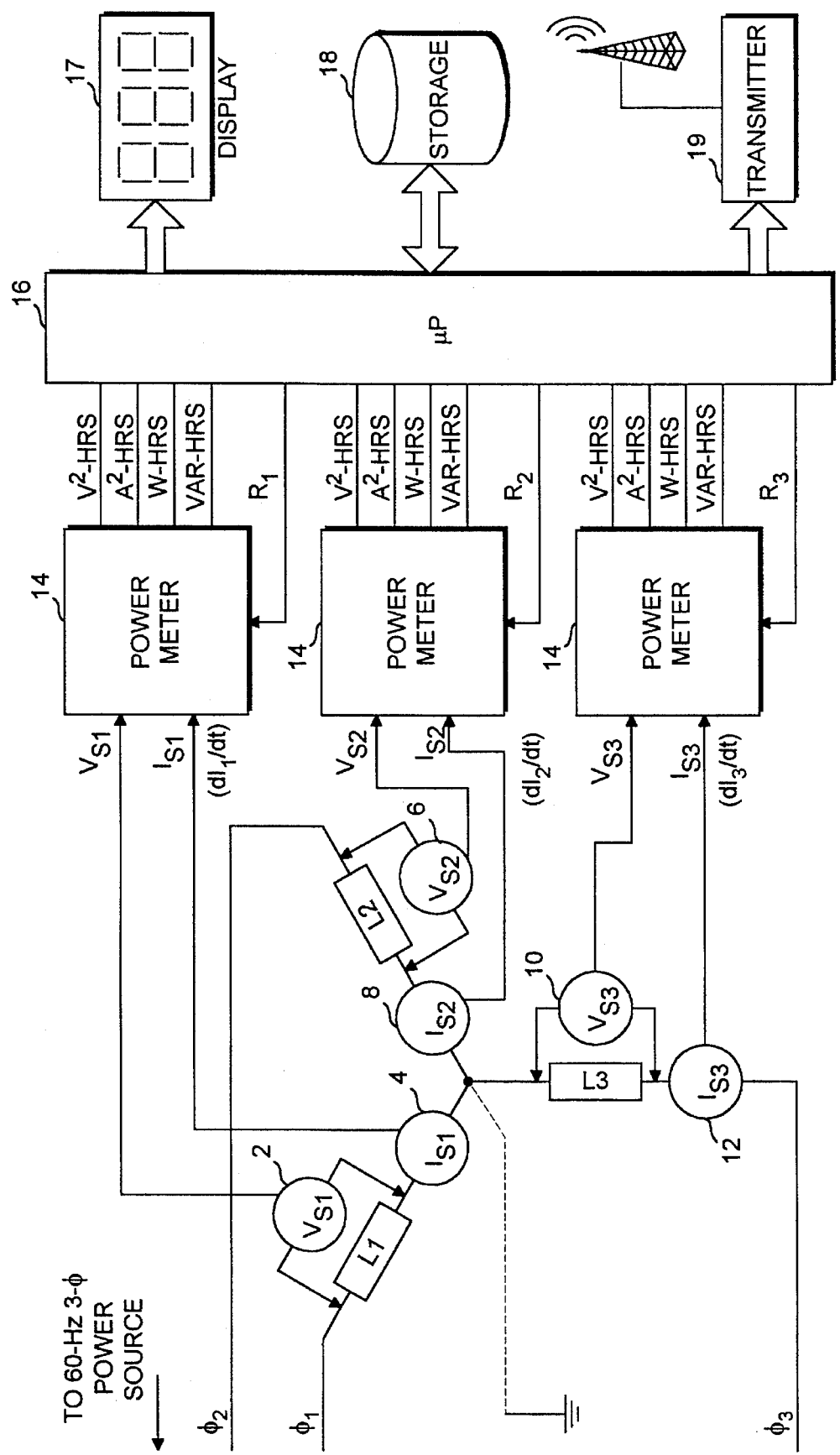
FIG. 1 is a block diagram showing the use of a particular embodiment of power meters according to the present invention to measure voltage, current, power and VAR in a three-phase load.

FIG. 1 shows an application of one embodiment of the present invention. Loads L1, L2, L3 comprise a three-phase load and are supplied with 60-Hz three-phase power (supply not shown), as is well known in the art of alternating current power systems. A voltage sensor 2 measures the voltage across load L1 and provides a corresponding analog voltage signal $V_{s1}$; while current sensor 4 measures the current through load L1 and provides a corresponding analog voltage signal $I_{s1}$, where $I_{s1}$ is proportional to the derivative with respect to time of the current flowing through load L1. Similarly, voltage sensor 6 provides signal $V_{s2}$, current sensor 8 provides signal $I_{s2}$, voltage sensor 10 provides signal $V_{s3}$, and current sensor 12 provides signal $I_{s3}$. FIG. 1 shows loads using three-phase power which has a fundamental frequency, f, of 60 Hz, however the present invention works equally well for any other frequency or frequencies, limited only by the bandwidth of the digital hardware.

Voltage signal $V_{s1}$ and current signal $I_{s1}$ are coupled to the inputs of a power meter 14. Power meter 14 measures the voltage and current inputs and, from those inputs, provides digital values representing volt$^2$-hours, amp$^2$-hours, watt-hours, and VAR-hours. Power meter 14 also has a reset input. FIG. 1 shows three such power meters with identical circuitry connected across each of three phases of the three-phase load, however the present invention works equally well across a single-phase load.

The outputs and the reset inputs of the power meters are coupled to microprocessor 16, which is in turn coupled to a display 17, a storage unit 18, and a transmitter 19.

In operation, the power meters 14 monitor the voltage and current inputs and accumulate values to its outputs as described in detail below. Microprocessor 16 periodically reads the four outputs from each power meter, and as appropriate, asserts reset signals R1, R2, or R3, causing the respective power meter 14 to clear its accumulators as described below and begin accumulating anew. Microprocessor 16 then causes display 17 to show one or more values read from the outputs of the power meters, storing other values in storage unit 18, and transmitting still other values to remote locations using transmitter 19. The operation of microprocessor 16, display 17, storage unit 18 and transmitter 19 are all well known in the art of microprocessor control, as are microprocessor programs to read outputs, send reset signals, display data, store data, and transmit data. One embodiment of the present invention comprises the system shown in FIG. 1 attached to a remote power customer, with transmitter 19 transmitting values to a remote power company receiver, which in turn supplies power consumption values to the power company for billing purposes.

Figure 2:
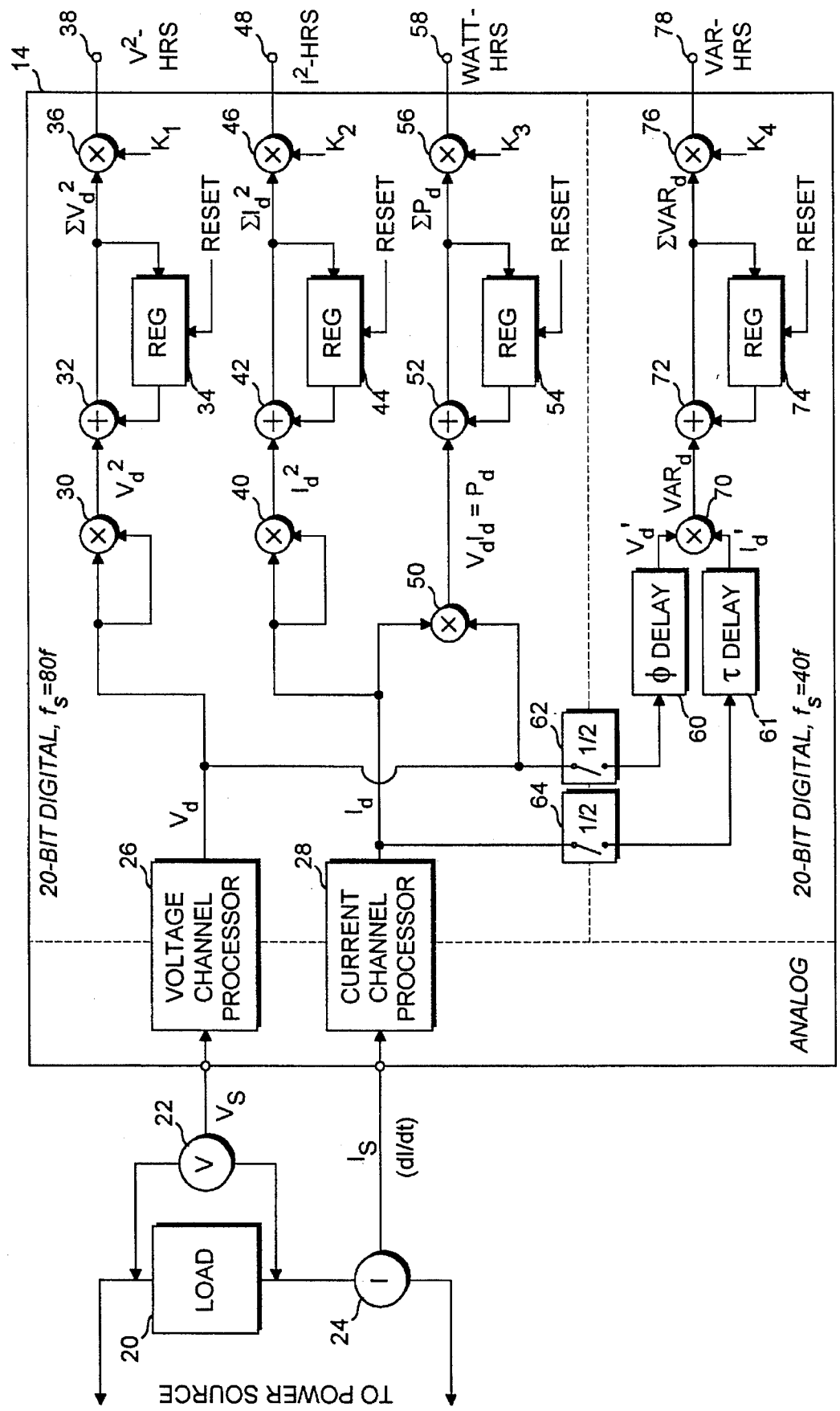
FIG. 2 is a block diagram of a particular embodiment of a power meter circuit according to the present invention.

FIG. 2 is a block diagram of one power meter 14 from FIG. 1. The voltage and current input signals, $V_s$ and $I_s$, are analog voltages provided by a voltage sensor 22 and a current sensor 24 respectively. $V_s$ is an analog voltage proportional to the voltage drop across load 20, while $I_s$ is an analog voltage proportional to the derivative with respect to time of the current flowing through load 20. In the typical application, the power to the load is a base frequency with distortion harmonics, therefore the input signals can be characterized by a sine wave of frequency f with harmonic distortion and other noise which diminishes at higher frequencies.

Voltage channel processor 26, whose operation is described below in connection with FIG. 4, converts the input signal, $V_s$, from an analog voltage to a digital signal, $V_d$, and current channel processor 28, whose operation is described below in connection with FIG. 3, converts the input signal, $I_s$, from an analog voltage to a digital signal, $I_d$. Herein, a digital signal means a stream of digital samples with samples occurring at a steady rate, the rate being a characteristic of the digital signal known as the sample rate, or sample frequency ($f_s$). Both $V_d$ and $I_d$ have a 20-bit amplitude resolution and a sample frequency, $f_s$, of 80 * f (also written as simply "80f"). Thus for f=60 Hz, $f_s$=4800 Hz.

The two digital sample streams, $V_d$ and $I_d$, are combined in various ways to produce outputs representing volt²-hours at node 38, amp²-hours at node 48, watt-hours at node 58, and VAR-hours (volt-amps reactive hours) at node 78. The circuits which manipulate the $V_d$ and $I_d$ sample streams will now be described.

A multiplier 30 combines $V_d$ with itself to produce $V_d^2$, and an adder 32 combines $V_d^2$ with the output of a register 34. Register 34 stores the output of adder 32 and is reset to zero by a reset signal R. Thus, register 34 serves as an accumulator of all the $V_d^2$ values beginning with the value provided by adder 32 after the reset signal R is asserted. Register 34, in combination with adder 32, provides the sample stream $\Sigma(V_d^2)$ to a multiplier 36. Multiplier 36 scales the sample stream from adder 32 to provide the sample stream $K_1\Sigma(V_d^2)$ representing the number of volt²-hours used by load 12. For example, in one embodiment, $V_d$ is a digital representation of the value of $V_s$ in volts and has a sample rate of 4800 Hz. In that embodiment, since 4800 samples of $V_d^2$ would be accumulated per second, and 17,280,000 per hour, volt²-hours can be found by using 1/17,280,000 for the constant $K_1$. A sample stream representing volt²-hours is thus provided at node 38.

The sample stream at node 38, and likewise for the other nodes 48, 58, 78, can be connected to suitable display devices, as is well known in the art, provided as an input to a microprocessor for such further processing as would be required, for example, for an automated customer billing system, or the sample stream could be connected to a radio transmitter to provide the sample stream to a remote billing center. These applications of the present invention are provided as illustrations and are not intended to limit the applications for which the present invention could be used.

Similar circuitry is provided for determining amp²-hours. A multiplier 40 combines $I_d$ with itself to produce $I_d^2$, and an adder 42 combines $I_d^2$ with the output of a register 44. Register 44 stores the output of adder 42 and is also reset to zero by a reset signal R. Thus, register 44 accumulates $I_d^2$ values which, in combination with adder 42, provides the sample stream $\Sigma(I_d^2)$ to multiplier 46. Multiplier 46 provides the sample stream $K_2\Sigma(I_d^2)$, which represents the number of amp²-hours used by load 12. $K_2$ is a constant chosen to scale the output of adder 42 properly. For example, in the embodiment mentioned above, $I_d$ is a digital representation of the value of the current flowing through load 20 in amps (an integration of the signal $I_s$) with $f_s$=4800 Hz, therefore the constant $K_2$ is equal to 1/17,280,000.

A sample stream representing watt-hours is provided at node 58 by the operation of multiplier 50, adder 52, register 54, and multiplier 55. Multiplier 50 combines $V_d$ with $I_d$ to produce a digitized representation of power, $P_d$, and adder 52 combines $P_d$ with the output of register 54. Register 54 stores the output of adder 52 and is also reset to zero by reset signal R. Thus, register 54 accumulates $P_d$ values, which in combination with adder 52 provides the sample stream $\Sigma P_d$ to multiplier 56. Multiplier 56 provides the sample stream $K_3\Sigma P_d$, which represents the number of watt-hours used by load 12. $K_3$ is a constant chosen to scale the output of adder 52 properly. In the embodiment mentioned above, $K_3$ is equal to 1/17,280,000. As is described in more detail below, the samples of $V_s$ and $I_s$ are taken at roughly the same time, and because the channels 26, 28 are carefully matched, the sample streams $V_d$ and $I_d$ are output by the channels aligned in time, so that a power measurement, such as $V_d * I_d$, can be easily found for that same aligned time.

The remaining circuitry shown in FIG. 2, which determines VAR-hours, will now be described. The sample stream $V_d$ is supplied to a decimator 62, which is coupled to phase delay 60, and the sample stream $I_d$ is supplied to a decimator 64, which is coupled to time delay 61. The output of phase delay 60, $V_d'$, and the output of time delay 61, $I_d'$, are coupled to the input of multiplier 70, which provides the $VAR_d$ samples to adder 72. Adder 72 adds the $VAR_d$ samples to the output of register 74. Register 74 stores the output of adder 72 and is reset to zero by reset signal R. Thus, register 74 accumulates $VAR_d$ values, which in combination with adder 72 provides the stream of $\Sigma VAR_d$ samples to multiplier 76. Multiplier 76 provides the value $K_4\Sigma VAR_d$, which represents the number of VAR-hours used by load 12. $K_4$ is a constant chosen to scale the output of adder 72 properly. In the embodiment mentioned above, $K_4$ is equal to 1/17,280,000.

Phase delay 60 provides a sign inversion and a 90° phase delay, resulting in a −90° phase delay. The phase delay is constant over a bandwidth of concern which, in one embodiment, is 15 times a fundamental frequency of 60 Hz.

Because phase delay 60 is a realizable filter, it has an unavoidable nonzero time delay. To compensate for this time delay, $I_d$ is also time delayed by time delay 61 for a time equal to the time delay of phase delay 60 so that the voltage and current values remain in sync. The circuitry used to implement a particular embodiment of phase delay 60 is discussed in connection with FIGS. 11–12. Decimators 62 and 64 decimate by two to double the time available to calculate instantaneous VAR values, albeit producing values half as often.

Of particular note is the fact that, for the electrical parameters which depend on the multiplication of pairs of $V_d$ and $I_d$ values, the $V_d$ and $I_d$ values should be aligned in time, i.e., they should both represent the measurement of the instantaneous voltage and instantaneous current at the load at a common point in time. If the difference in delay between voltage channel processor 26 and current channel processor 28 is merely a fixed time delay of an integral number of samples at $f_s$, the delay could be handled by adding delay elements to the end of one or the other of the channel processors to even them out. However, as pointed out below, when a differentiating current sensor is used, phase variations and non-integral delays are part of the current channel processor.

Figure 3:
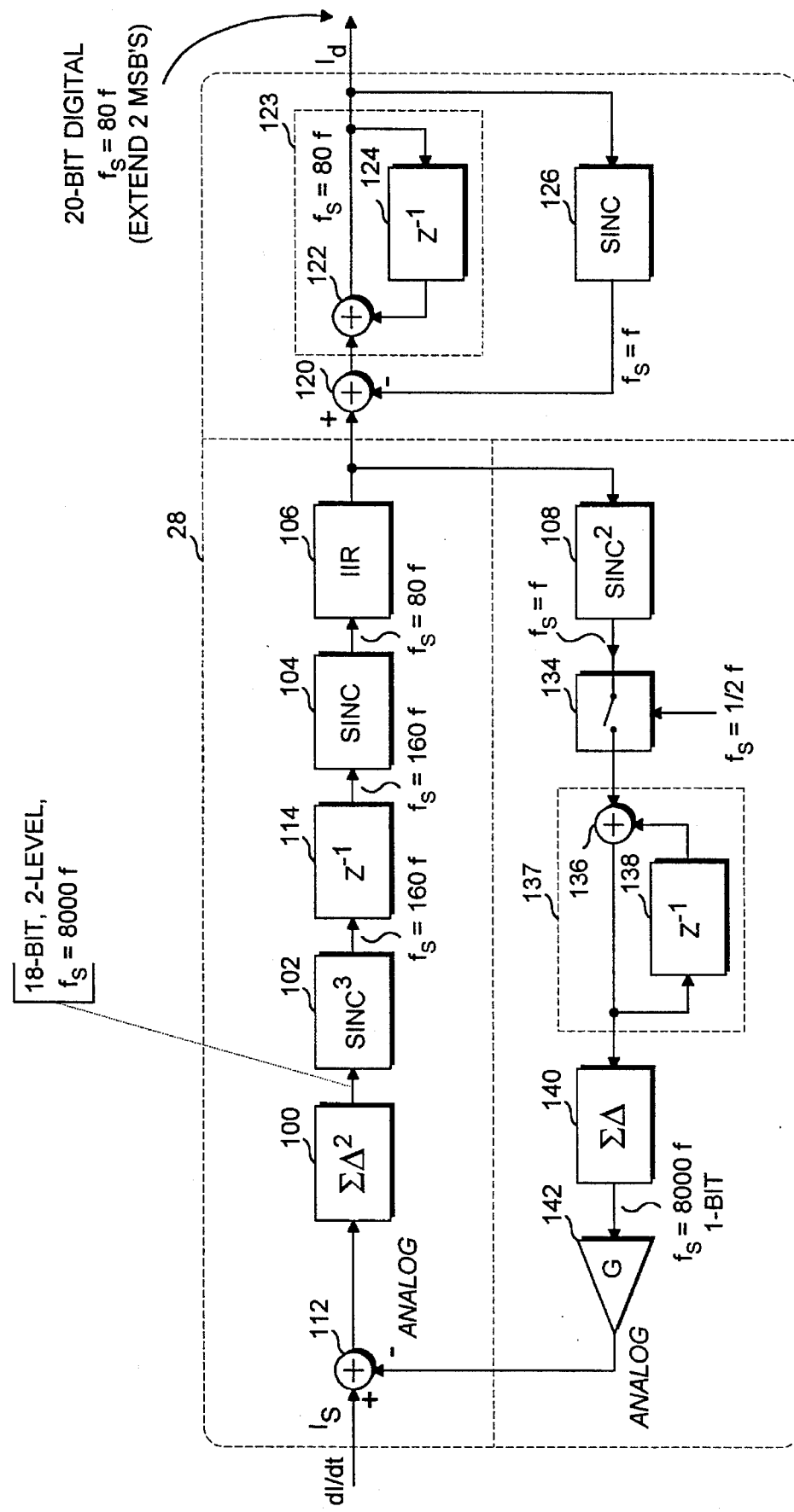
FIG. 3 is detailed block diagram of a current channel processor used in the power meter circuit of FIG. 2.

FIG. 3 is a detailed view of current channel processor 28. Current channel processor 28 has an input for $I_s$, the analog di/dt signal from current sensor 24 (shown in FIG. 2), and an output for $I_d$, the digital current signal, or sample stream, with 20-bit resolution at the 80f sample rate. $I_s$ is an analog signal limited in amplitude to a predetermined range, such as −5 v to +5 v. The particular range is unimportant, since any range of interest can be scaled to fit into a predetermined range through the proper selection of voltage sensors, current sensors, and values for $K_{1-4}$. $I_s$ is also assumed to be band limited between 0 Hz and some high frequency, such as 4000f, where f is the fundamental frequency. If the signal is not band-limited, simple analog filters can be used to band limit the signal, as is well known in the art of digital sampling.

Current channel processor 28 includes a feedforward path, a feedback path, and an integrator path. The feedforward path accepts an analog input signal, digitizes the input, filters it and outputs it to the integrator path and the feedback path. The feedback path provides an analog feedback signal which is combined with the signal input to the feedforward path. The output of the integrator path is the output of current channel processor 28.

The feedforward path begins with a differential adder 112 which is used to subtract the feedback signal from the input signal. In the feedforward path, differential adder 112 is followed, in order, by a delta-sigma modulator 100, a third-order sinc filter 102, a delay 114, a first-order sinc filter 104, and an infinite-impulse response (IIR) filter 106. Sinc filters are well known in the art of digital filtering, and are so named because the complex frequency response of such a filter is $H(z)=\text{sinc}(z)$, which is $\sin(z)/z$.

Delta-sigma modulator 100 inputs an analog signal and outputs a two-level sample at a sample frequency, $f_s$, of 8000f. Filter 102, shown in greater detail in FIG. 6, inputs the 1-bit samples from delta-sigma modulator 100 at the sample rate of $f_s=8000f$, and outputs 18-bit samples at $f_s=160f$. Delay 114 also outputs 18-bit samples at $f_s=160f$. Filter 104, shown in greater detail in FIG. 7, has a decimation rate of one half, so it outputs 18-bit samples at $f_s=80f$. IIR filter 106 also outputs 18-bit samples at $f_s=80f$.

Figure 8:
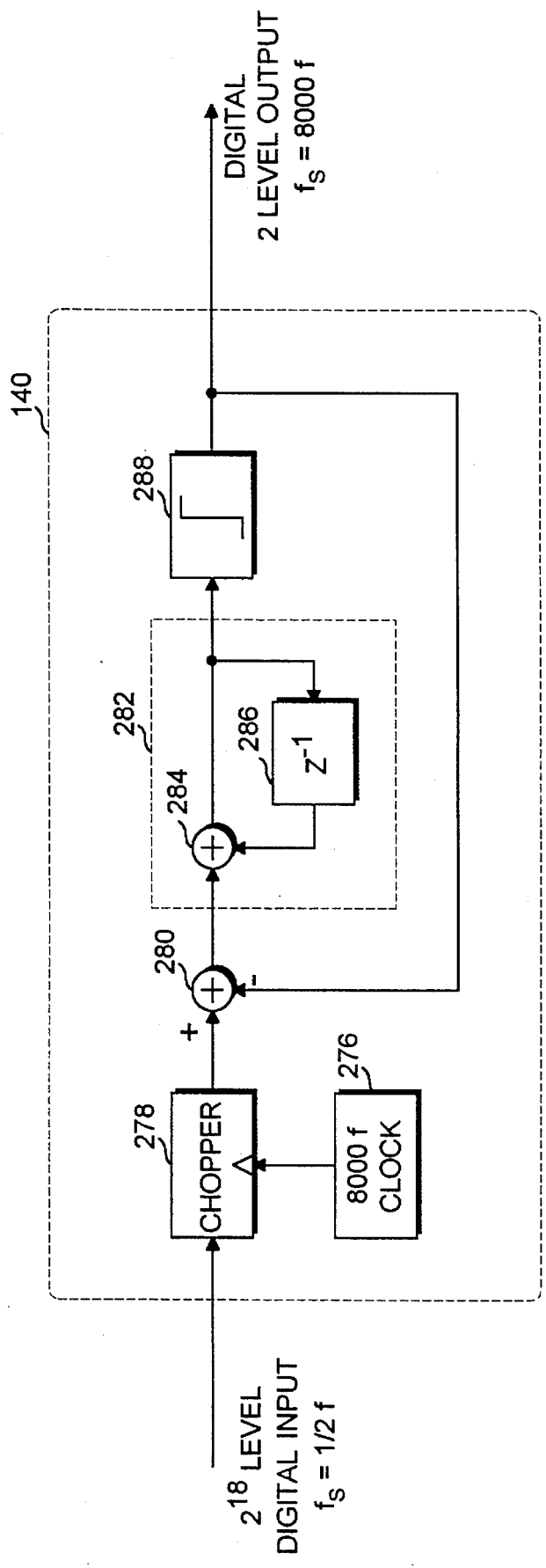
FIG. 8 is a schematic diagram of a digital delta-sigma modulator used in the current channel processor.
Figure 9:
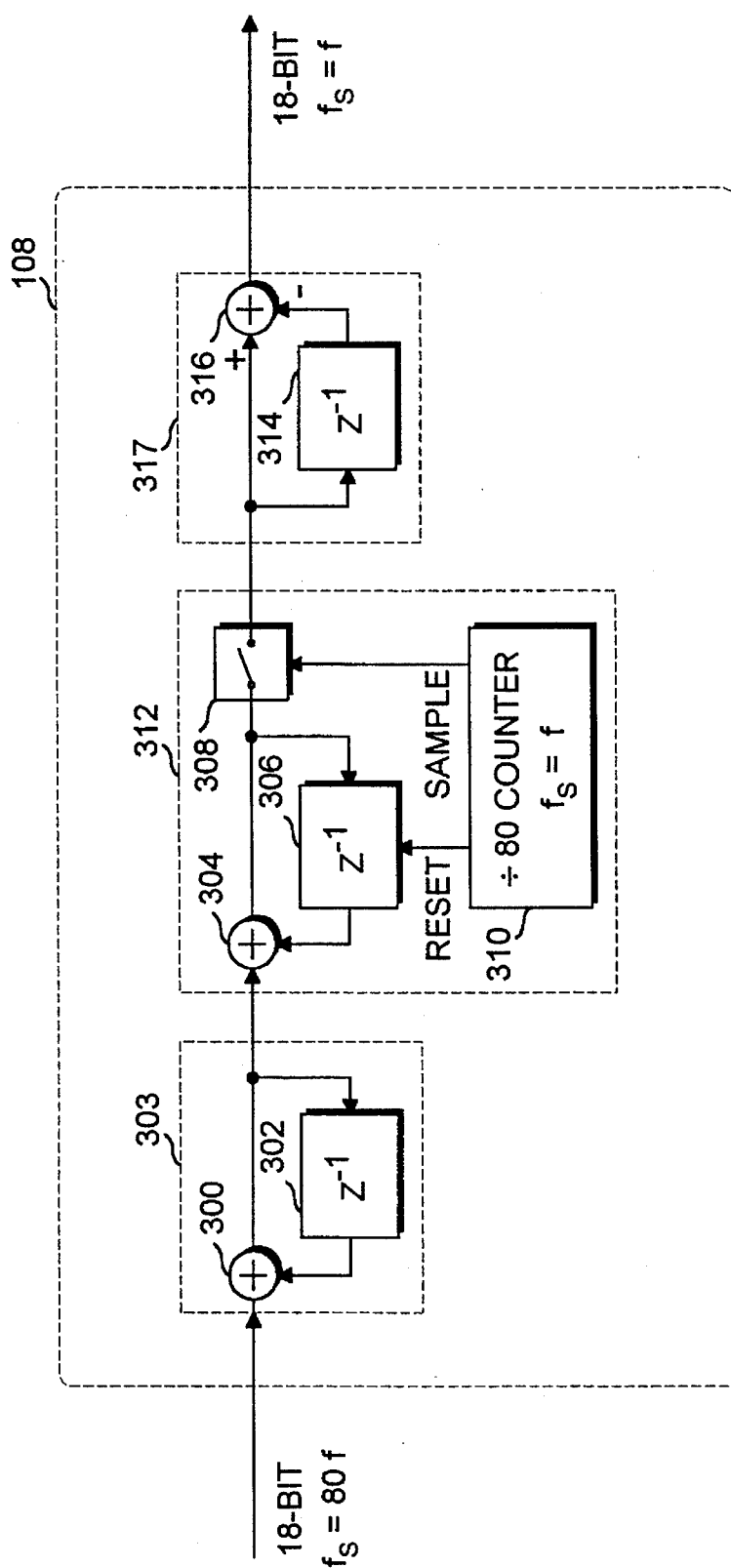
FIG. 9 is a schematic diagram of a second-order decimating sinc filter used in the voltage and current channel processors.

The feedback path begins with a second-order sinc filter 108, shown in greater detail in FIG. 9, which accepts the output of IIR filter 106. In the feedback path, filter 108 is followed, in order, by a decimator 134, an integrator 137 made up of adder 136 and delay 138, a digital delta-sigma modulator 140, shown in greater detail in FIG. 8, and an analog gain stage 142. The feedback path provides an analog DC error voltage which is subtracted from the signal by differential adder 112.

Filter 108 outputs 18-bit samples at $f_s=f$, which are decimated in half by decimator 134. The output of decimator 134 is integrated by integrator 137, which outputs 18-bit samples at $f_s=f/2$ to delta-sigma modulator 140, which outputs 1-bit samples at $f_s=8000f$. Analog gain stage 142 amplifies its input to provide as high a feedback gain as possible.

Figure 10:
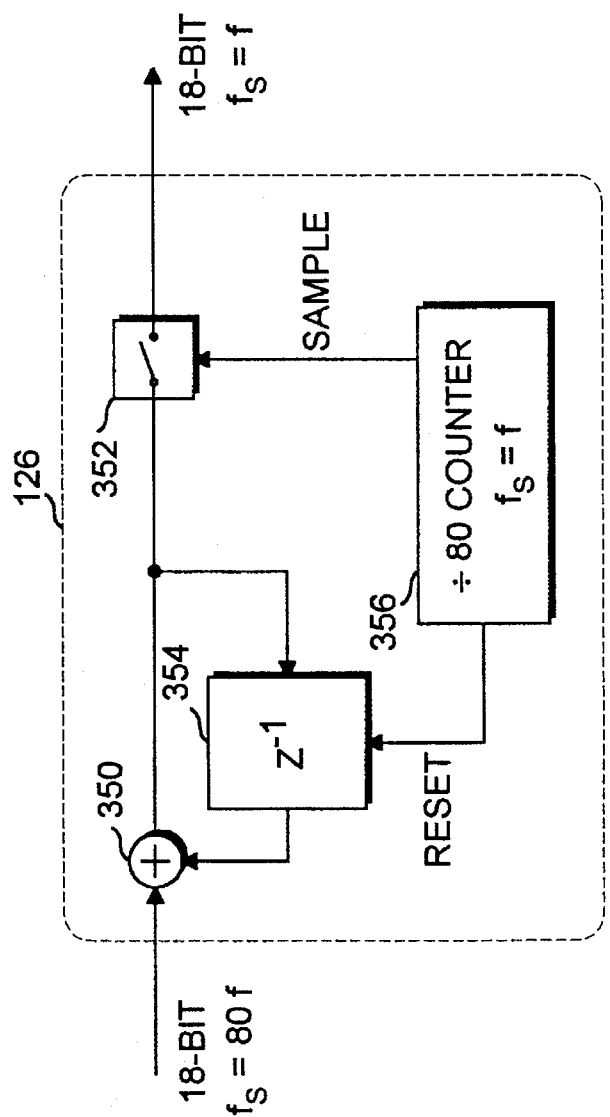
FIG. 10 is a schematic diagram of a low frequency first-order decinating sinc filter used in the current channel processor.

The integrator path begins at an additive input to an adder 120, followed by an integrator 123 comprising an adder 122 and a delay 124, with a first-order sinc filter 126, shown in greater detail in FIG. 10, feeding the output back to a subtractive input of adder 120. The input to the additive input is 18-bit digital samples at $f_s=80f$, while the input at the subtractive input is 18-bit samples at $f_s=f$. Digital integrator 123 accumulates 18-bit samples at $f_s=80f$, which are then output as sign-extended 20-bit values. The extension of the samples by two bits allows for their further manipulation in power meter 14 as 20-bit values without overflows. Filter 126 decimates by 80, to provide the $f_s=f$ signal at the subtractive input to adder 120.

The operation of current channel processor 28 will now be described.

Figure 5:
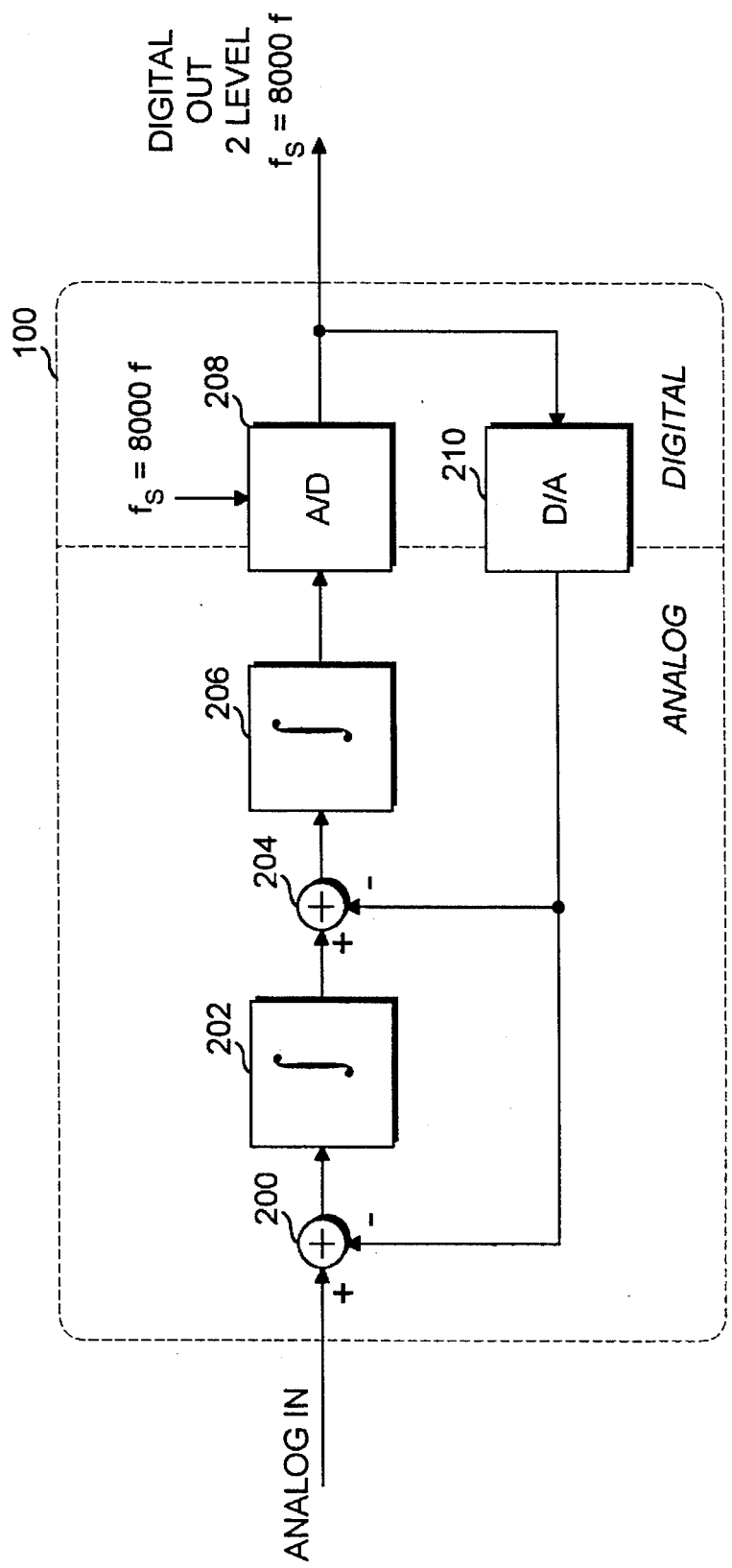
FIG. 5 is a schematic diagram of a second-order delta-sigma modulator used in the voltage and current channel processors.

The analog current signal, $I_s$, is sampled by delta-sigma modulator 100, which is shown in greater detail in FIG. 5. $I_s$ is amplitude limited such that modulator 100 does not saturate, and $I_s$ is frequency-limited such that signals above 4000f do not fold back into the signal band upon being digitized. The output of delta-sigma modulator 100 is an 18-bit digital signal, but it only takes on two values: 111 . . . 111 representing the maximum positive amplitude of $I_s$, and 000 . . . 000 representing the maximum negative amplitude of $I_s$. A typical delta-sigma modulator outputs a single bit, but by fanning out the single bit result 18 times, the two 18-bit values are generated.

While the particular embodiment of a delta-sigma modulator according to the present invention shown in FIG. 3 provides an 18-bit output, other resolutions are also possible. Furthermore, the present invention does not require that the 18-bit values be sign-extended to 20-bit values at the output of the channel processors, as is true in the embodiment shown in FIG. 3. For example, it may be possible to truncate the 18-bit output to 16 bits, for easier manipulation by 16-bit signal processors.

One characteristic of a delta-sigma modulator is that it outputs a square wave which varies between two maximum values, where the width of the pulses in the square wave are such that the local average of the pulses, or the low frequency components, is equal to the local average of input signal. Thus, in the frequency domain, the output of the delta-sigma modulator is the input signal plus quantization noise, where the quantization noise is concentrated at the higher frequencies. For a discussion of oversampling and delta-sigma modulation techniques, see Candy and Temes, *Oversampling Delta-Sigma Data Converters*, pp. 1–25 (IEEE Press, 1992).

These higher frequencies are removed by the other filters in current channel processor 28. Third-order sinc filter 102 filters out higher frequencies while not greatly affecting components in the first 40 harmonics, or from 0 to 40f. Because of the high attenuation filter 102 provides at higher frequencies, the sample stream provided by delta-sigma modulator 100 can be decimated without loss of resolution Filter 102, in addition to low pass filtering the sample stream, decimates it by a factor of 50.

The samples are then delayed by one sample of $f_s=160f$, which is a half sample at 80f, the sample rate of integrator 123 and the current channel processor 28. The samples at $f_s=160f$ are further filtered and decimated by sinc filter 104. While filter 102 and 104 might be combined into a fourth-order sinc filter (an in such a case, a third-or second-order filter might be sufficient), their separation is necessary so that delay 114 can be inserted between them to delay the current samples by a period of $1/(160f)$.

The half-sample delay keeps the outputs of the voltage channel and the current channel in relative sync, since the overall relative phase shift of the current sensor, the half-sample delay, and the integrator combined is zero. Another way of expressing this effect is with the transfer functions of these three elements. The transfer function of the current sensor, half-sample delay, and digital integrator are $H(z)=jw$, $H(z)=z^{-\frac{1}{2}}$, and $H(z)=1/(1-z^{-1})$, respectively Thus, their overall transfer function is $H(z)=jw*z^{-\frac{1}{2}}/(1-z^{-1})$. This expression simplifies to $H(z)=(w/2)/\sin(w/2)$, making clear that the combined phase shift is 0° for all frequencies. Although the combined phase is 0° for all frequencies, the amplitude rises for higher frequencies, which is apparent when the combined transfer function is further simplified to $H(z)=1/\mathrm{sinc}(w/2)$.

IIR filter 106 low pass filters the sample stream to remove frequencies higher than the frequencies of interest, which, in a utility power meter is generally from 0 Hz to 15f. One reason to attenuate harmonics above 15f is to avoid aliasing when the sample rate is reduced to 40f by decimators 62 and 64 for the VAR-hours calculation. IIR filter 106 also compensates for the roll-off of the sinc filters in the channel and partially compensates for transfer function of integrator 123, as explained below in more detail in connection with FIGS. 13–16.

The transfer function of IIR filter 106, $H_1(z)$, is shown by Equation 1 and Table 1.

TABLE 1

$$H_1(z) = h_0 * \frac{z^2 + h_{a1}z + h_{a2}}{z^2 + h_{b1}z + h_{b2}} * \frac{z^2 + h_{c1}z + h_{c2}}{z^2 + h_{d1}z + h_{d2}} \quad (1)$$

| Factor | Value |
| --- | --- |
| $h_0$ | .091675 |
| $h_{a1}$ | 2.211430 |
| $h_{a2}$ | 1.227640 |
| $h_{b1}$ | −.271138 |
| $h_{b2}$ | .110305 |
| $h_{c1}$ | .897303 |
| $h_{c2}$ | .984388 |
| $h_{d1}$ | −.225512 |
| $h_{d2}$ | .622975 |

Integrator 123 integrates the sample stream which the feedforward path outputs, so that $I_d$ represents the current through load 20 (shown in FIG. 2) instead of its time derivative. However, since integrators tend to saturate in the presence of DC offsets, two feedback mechanisms are provided, the feedback path mentioned above, and sinc filter 126. The feedback path eliminates the DC at the input to the integrator, and sinc filter 126 eliminates any additional DC created by impulse noise accumulated in integrator 123. Since most of the energy in $I_s$, and therefore $I_d$, is in the fundamental frequency, f, and its harmonics, sinc filter 126, which has zeros at each non-DC multiple of f, passes only the DC component of the output back to adder 120 to be subtracted out of the samples accumulated by integrator 123. Sinc filter 126 prevents integrator 123 from saturating due to an impulse which is not earlier filtered out, thus acting as an impulse noise bleeder.

The feedback path eliminates DC components which are introduced in the feedforward path, such as would be caused by a nonzero comparator threshold in delta-sigma modulator 100. The feedback path begins with second-order sinc filter 108. Since filter 108 is a sinc filter, it has zeroes at f and at each multiple of f. Since most of the incoming signal is expected to be concentrated at the f and its harmonics, second-order sinc filter 108 filters out all but the DC component of the digital signal at the output of the feedforward path.

A second-order sinc filter is used for filter 108, as opposed to a first-order sinc filter, to provide wider zeroes in the transfer function of the filter at the multiples of f. The wider zeroes allow more variation in the input fundamental frequency. Although the sampling rates of various digital filtering elements has been described as being multiples of the input frequency f, there may be some variation, since the sampling clocks are not phase locked to the input frequency. The penalty for using a second-order filter over a first-order filter is that the settling time of the filter is increased. To overcome this penalty, decimator 134 is provided to reduce the sampling rate of the feedback loop by a factor of two which shortens the settling time.

Integrator 137 totals the DC component, and digital delta-sigma modulator 140 provides a high sampling rate, low resolution indication of the total DC offset, which allows for an easy implementation of gain stage 142. Gain stage 142 converts the digital delta-sigma modulator 140 output to an analog signal, essentially a high frequency square wave, which is subtracted from the input signal. The gain, G, of analog gain stage 142 should be chosen such that the swing from −G to +G at the output of analog gain stage 142 is large enough to compensate for the DC offset of the input signal. However, G should not be too large, as the signal-to-noise ratio of current channel processor 28 drops as G increases, primarily because as G increases, the output of differential adder 112 pegs the limits of delta-sigma modulator 100 more often.

Figure 4:
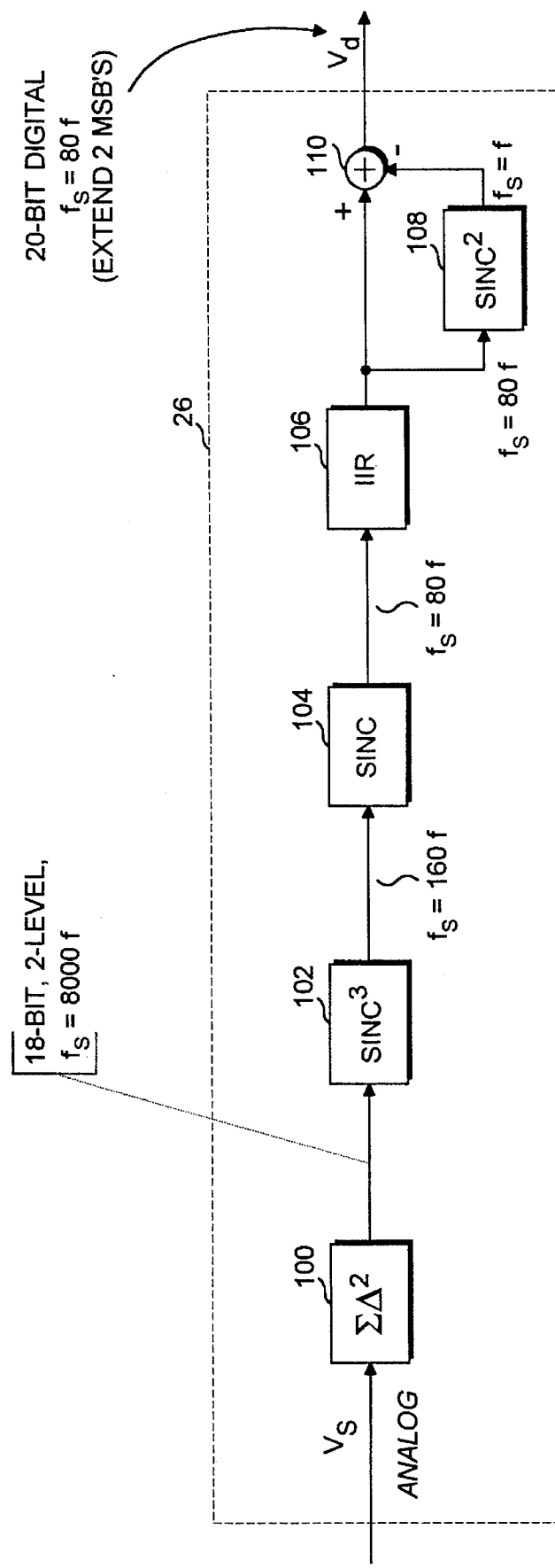
FIG. 4 is a detailed block diagram of a voltage channel processor used in the power meter circuit of FIG. 2.

FIG. 4 is a more detailed view of voltage channel processor 26 shown in FIG. 2. Voltage channel processor 26 contains many of the same elements of the current channel processor, for the same purpose: delta-sigma 100, and filters 102, 104, 106. Its input is also an analog signal and it also outputs 20-bit samples at $f_s=80f$. One difference, though, is that the input signal does not need to be integrated, making voltage channel processor 26 simpler than current channel processor 28. The input, $V_s$, is an analog signal limited in amplitude to a predetermined range and band-limited, as with $I_s$.

Voltage channel processor 26 is similar to the feedforward path of processor 28 with delay 114 omitted. Sinc filter 104 is not necessarily required in voltage channel processor 26, but it is present to match sinc filter 104 in the current channel. The set of filters in the two channels are matched to avoid relative phase shifts or gains. However, in alternate embodiments, third-order sinc filter 102 decimates to the sample rate of 80f, eliminating the need for the decimation by two provided by sinc filter 104.

At the output of IIR 106, any DC offset in the output signal is removed by a second-order sinc filter 108, which is equivalent to filter 108 used in the feedback path shown in FIG. 3. IIR filter 106 provides an 18-bit digital signal at $f_s=80f$ to filter 108, and to an additive input of an adder 110. Filter 108 provides a decimated, 18-bit sample stream at $f_s=f$ to a subtractive input of adder 110. Thus, adder 110 subtracts the output of filter 108 from the output of IIR 106, and provides an 18-bit digital signal at $f_s=80f$. Voltage channel processor 26 provides this 18-bit signal with the most significant bit sign-extended to two additional bits as an output, resulting in a 20-bit digital signal at a sampling frequency of 80f, as shown in FIG. 2.

Since the voltage channel signal is primarily a fundamental and harmonics, second-order sinc filter 108, with zeroes at each multiple of the fundamental, filters out all but the DC component of the voltage channel signal.

A typical power grid provides variable power by varying the peak amplitude of the current and keeping the peak amplitude of the voltage constant. Consequently, the signal from voltage sensor 22 is roughly sinusoidal with a relatively constant peak amplitude. However, the dynamic range of the signal from current sensor 24 tends to be greater, as the peak amplitude of the signal varies with the amount of power consumed by the load. Thus, the digitized current signal is more prone to errors, especially during periods of low power use. This fact is part of the motivation for the current feedback path.

FIG. 5 shows delta-sigma modulator 100 in greater detail. The analog input passes through adder 200, integrator 202, adder 204, integrator 206, and is then sampled by 1-bit analog-to-digital converter (A/D) 208 at a sampling frequency of $f_s=8000f$. Because A/D 208 is a 1-bit converter, if the voltage from integrator 206 is positive, A/D 208 will output a 1, and if the voltage is negative, A/D 208 will output a 0. The resulting digital value is converted back to analog by digital-to-analog converter (D/A) 210 and is subtracted from the input signal at adders 200 and 204. Because integrators 202 and 206 are integrating the difference between the input signal and the output samples, over the long run (i.e. for lower frequencies), the average output value will equal the average input value.

Figure 6:
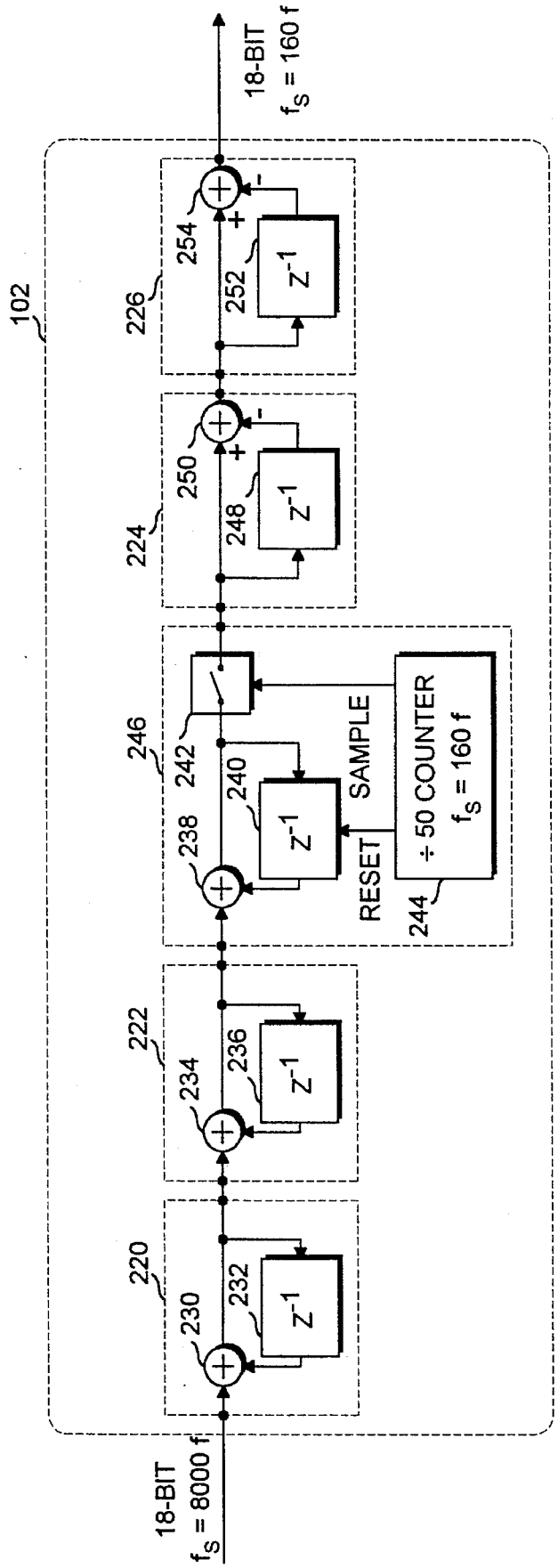
FIG. 6 is a schematic diagram of a third-order decimating sinc filter used in the voltage and current channel processors.

FIG. 6 shows third-order sinc filter 102 in greater detail. The input to filter 102 is connected to an integrator 220, which comprises an adder 230 and a delay 232 connected to the output and feeding back to one input of adder 230. The output of integrator 220 is connected to the input of a second integrator 222, which comprises an adder 234 and a delay 236 connected to the output and feeding back to one input of adder 234.

The output of integrator 222 is connected to the input of an integrate-and-dump filter 246, which comprises an adder 238, a resettable delay 240 connected to the output and feeding back to one input of adder 238, a decimator 242 connected to the output of adder 238, and a decimation counter 244, which triggers the sampling of adder 238 output and also triggers the reset of delay 240.

The output of integrate-and-dump filter 246 is connected to the input of a differentiator 224, which comprises a delay 248 and a differential adder 250, the input of delay 248 connected to the output of differential adder 250 and the output of delay 248 connected to the subtractive input of differential adder 250, whose additive input is the input to differentiator 224. The output of differential adder 250, which is also the output of differentiator 224, is connected to the input of a second differentiator 226, which comprises a delay 252 and a differential adder 254. The output of differentiator 226 forms the output of third-order sinc filter 102.

In operation, an 18-bit digital sample stream at $f_s=8000f$ is applied to the input of filter 102. The sample stream is then integrated twice, first by integrator 220, then by integrator 222. This doubly integrated stream is then applied to integrate-and-dump filter 246.

Integrate-and-dump filter 246 operates as follows. Adder 238 and resettable delay 240 connected to the output and a first input to adder 238, accumulate the samples from the second input to adder 238. The accumulated, or integrated, value is then sampled by decimator 242, after which resettable delay 240 is reset to start a new integration. Both delay 240 and decimator 242 receive their respective timing signals from decimation counter 244. Thus, for every 50 samples of input arriving a rate of 8000f, decimator 242 passes one sample to the output of integrate-and-dump filter 246, after which delay 240 is reset, i.e. a zero is put at its input for one input sample time. The output of integrate-and-dump filter 246 is a sample stream with a sample rate of 160f.

The output of integrate-and-dump filter 246 is then differentiated once by differentiator 224, then a second time by differentiator 226. The output of differentiator 226 forms the 18-bit, $f_s=160f$ output sample stream for third-order sinc filter 102. The third-order sinc filter 102 as shown in FIG. 6 is used in current channel processor 28 (see FIG. 3) and in voltage channel processor 26 (see FIG. 4).

Figure 7:
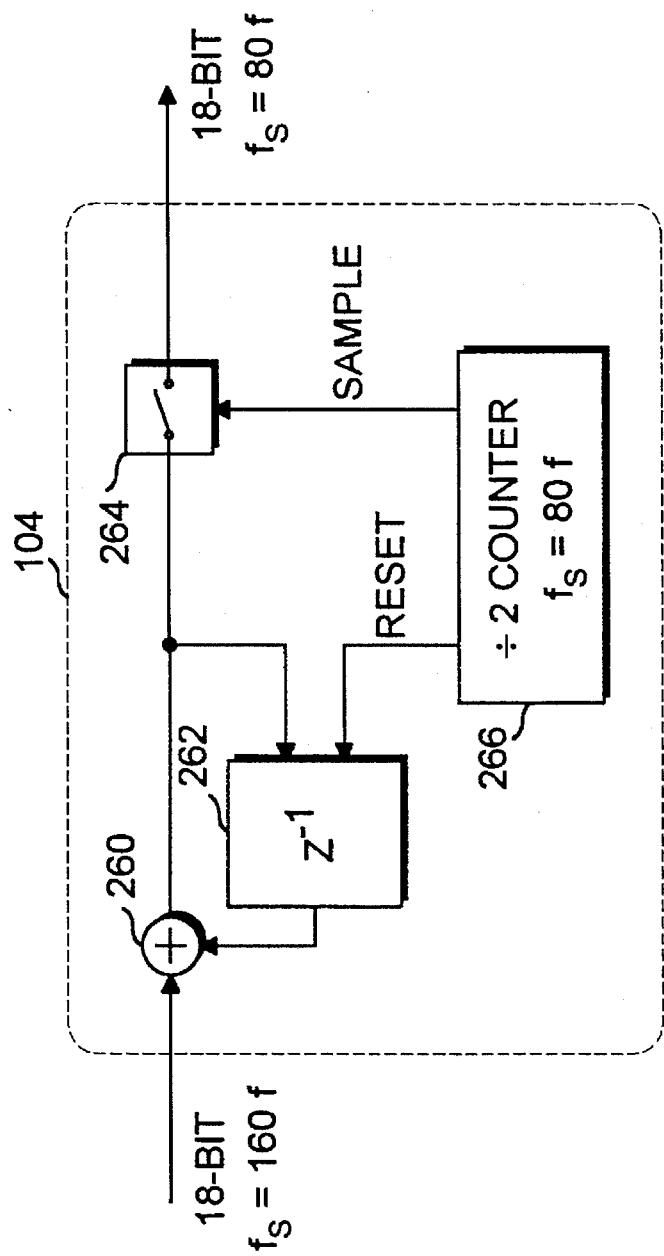
FIG. 7 is a schematic diagram of a first-order decimating sinc filter used in the voltage and current channel processors.

FIG. 7 shows first-order sinc filter 104 in greater detail. This filter is an example of an integrate-and-dump filter. First-order sinc filter 104 comprises an adder 260, a resettable delay 262 connected to the output of adder 260 which has an output feeding back to a second input of adder 260, a decimator 264 connected to the output of adder 260, and a decimator counter 266 which triggers the sampling of the output of adder 260 and also triggers the reset of delay 262.

In operation, an 18-bit digital sample stream at $f_s=160f$ is applied to the input of filter 104, which is also one input of adder 260. Adder 260 and resettable delay 262 connected to the output and one input to adder 260, accumulate the samples from the other input to adder 260. The accumulated, or integrated, samples are sampled by decimator 264, then resettable delay 262 is reset to start a new integration. Both resettable delay 262 and decimator 264 receive their respective timing signal from decimator counter 266. Thus, for every two samples of input arriving a rate of 160f, decimator 264 passes one sample to the output of first-order sinc filter 104, after which resettable delay 262 is reset, i.e. a zero is put at its input for one input sample time. The resulting output of first-order sinc filter 104 is a sample stream at $f_s=80f$.

The output of first-order sinc filter 104 is a stream of 18-bit samples at a sample rate of 80f. A first-order sinc filter 104 as shown in FIG. 7 is used in current channel processor 28 (see FIG. 3) and in voltage channel processor 26 (FIG. 4).

FIG. 8 shows digital delta-sigma modulator 140 in more detail. The input of digital delta-sigma modulator 140 is also the input to a chopper 278. The clock input to chopper 278 is coupled to clock 276. The output of chopper 278 is connected to an additive input to a differential adder 280. A subtractive input to differential adder 280 is coupled to the output of digital delta-sigma modulator 140. The output of differential adder 280 is coupled to the input of an integrator 282, which comprises adder 284 and delay 286. The output of integrator 282 is coupled to the input of sign extractor 288, whose output forms the output of digital delta-sigma modulator 140.

In operation, a sample stream at $f_s=\frac{1}{2}f$ is applied to the input of digital delta-sigma modulator 140 by integrator 137 (shown in FIG. 3). Chopper 278 converts the input samples to a higher sample rate of 8000f, by simply copying each input sample to its output each cycle of an 8000f clock. Thus, the remainder of digital delta-sigma modulator 140 has a sample rate of 8000f.

Differential adder 280 subtracts the output of digital delta-sigma modulator 140 from the input sample stream, integrator 282 integrates the sample stream, and sign extender 288 outputs the signs of samples of the integrated digital signal, which are output and is also fed back to differential adder 280. Thus, an 18-bit digital signal is input from integrator 282 to sign extractor 288, which outputs one of two values, either +1 if the output of integrator 282 is zero or positive, or −1 if the output of integrator 282 is negative.

FIG. 9 shows second-order sinc filter 108 in greater detail. The input to the filter is coupled to an integrator 303, which comprises an adder 300 and a delay 302 coupled to the output of adder 300 and feeding back to a second input of adder 300. The output of integrator 303 is coupled to the input of an integrate-and-dump filter 312, which comprises an adder 304, a resettable delay 306 connected to the output and feeding back to one input of adder 304, a decimator 308 coupled to the output of adder 304, and a decimation counter 310, which triggers the sampling of adder 304 output and also triggers the reset of delay 306.

The output of integrate-and-dump filter 312 is coupled to the input of a differentiator 317 which comprises a delay 314 and a differential adder 316. The input of differentiator 317 is coupled to an input of delay 314 and an additive input of adder 316. The output of delay 314 is coupled to a subtractive input of adder 316. The output of differentiator 317 forms the output of second-order sinc filter 108.

In operation, a stream of 18-bit samples at $f_s=80f$ is applied to the input of filter 108, where the samples are then integrated by integrator 303. These integrated samples are then applied to integrate-and-dump filter 312, which operates in the same manner as the integrate-and-dump filters found in FIGS. 6 and 7, except that decimation counter 310 triggers every 80 samples. Thus, with an input sample rate of 80f, the output sample rate is f.

The output of integrate-and-dump filter 312 is then differentiated by differentiator 317. The output of differentiator 317 forms the 18-bit, $f_s=f$ output of second-order sinc filter 108. The second-order sinc filter as shown in FIG. 9 is used in current channel processor 28 (see FIG. 3) and in voltage channel processor 26 (see FIG. 4).

FIG. 10 shows first-order sinc filter 126 in greater detail. This filter is constructed, and operates, in essentially the same way as first-order sinc filter 104, except for the sample rates. The input sample rate for first-order sinc filter 126 is 80f, and with a decimation counter 356, which decimates by 80, the output sample rate is f. A first-order sinc filter as shown in FIG. 10 is used in current channel processor 28 (see FIG. 3).

Figure 11:
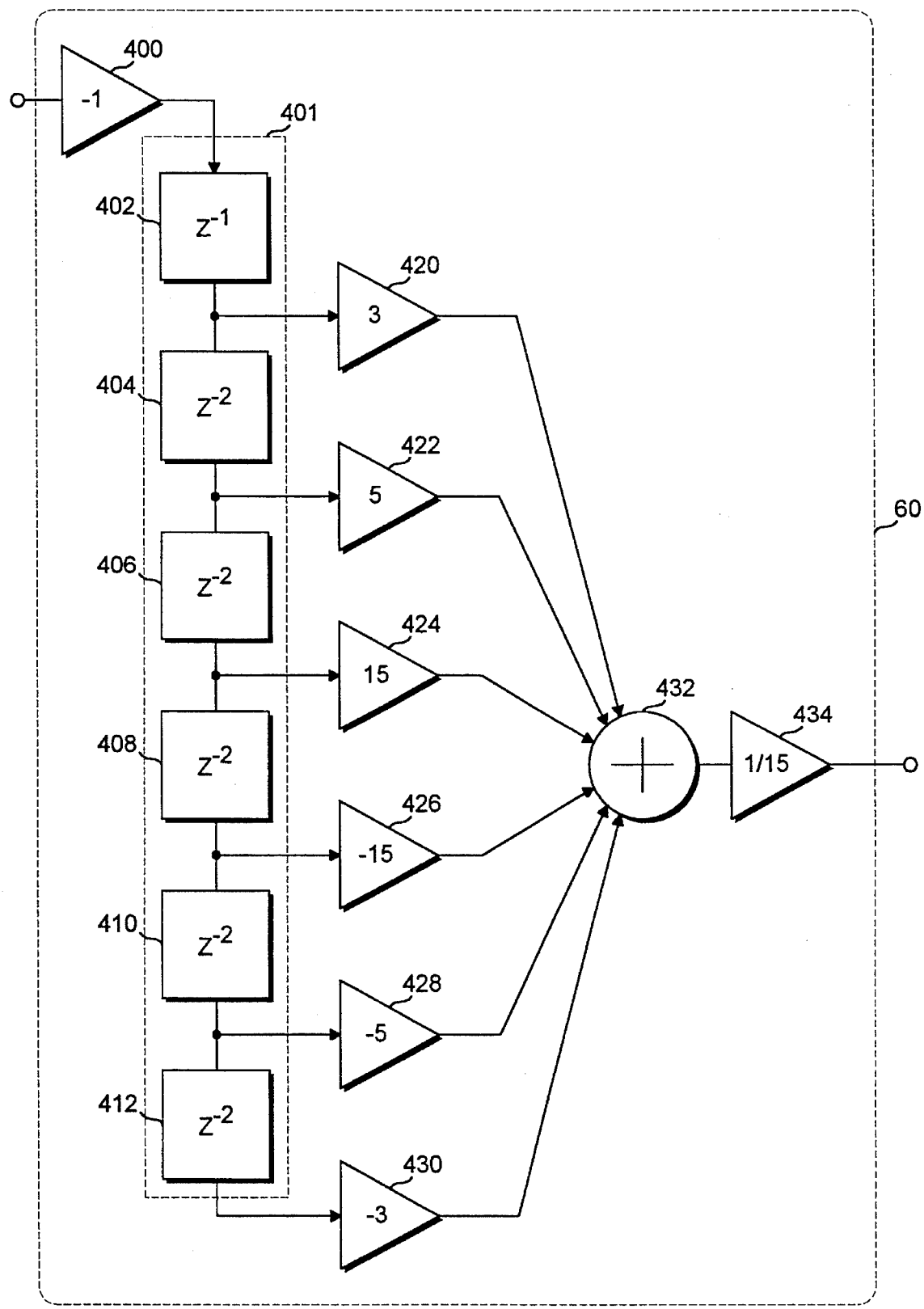
FIG. 11 schematic diagram of one embodiment of a digital phase delay.

FIG. 11 shows one embodiment of a phase delay 60. The input to phase delay 60 is also the input to sign invertor 400. The output of sign invertor 400 is connected to the input of delay ladder 401. Delay ladder 401 comprises single delay 402 and double delays 402, 404, 406, 408, 410, and 412, with a tap after each delay. The taps are connected to multipliers 420, 422, 424, 426, 428, and 430, as shown in FIG. 11. Each of the multipliers multiplies its input by the factor shown on the multiplier in FIG. 11. The outputs of multipliers 420, 422, 424, 426, 428, and 430 are connected to inputs of an adder 432. The output of adder 432 is connected to the input of multiplier 434, which multiplies the input samples by $1/15$. The output of multiplier 432 forms the output of digital phase delay 60.

In operation, input samples are supplied at a sample rate of 40f as shown in FIG. 2. After 13 samples have been supplied, phase delay 60 begins to output a properly phase-shifted sample stream at the output of multiplier 432. Accordingly, digital phase delay 60 has the transfer function:

$$H(z)=1/15 *(3z^{-5}+5z^{-3}+15z^{-1}-15z^1 -5z^3-3z^5),$$

which, when delayed by five or more sample cycles, becomes a realizable filter. The transfer function is achieved here by adding a single delay to the input to simplify construction of digital phase delay 60 and delaying the current sample stream by a total of six samples, in effect advancing the voltage channel signal by six samples. The current sample stream is delayed by six samples by time delay 61, which has a transfer function of $H(z)=z^{-6}$.

Figure 12:
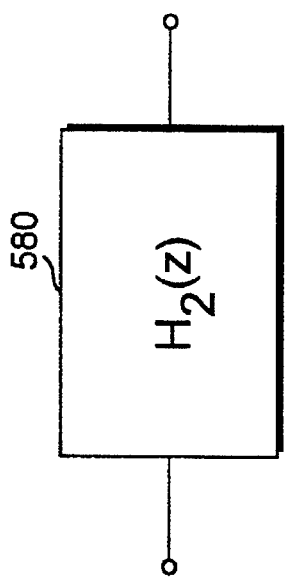
FIG. 12 is a schematic diagram of an alternative embodiment of a digital phase delay.

FIG. 12 shows an alternate embodiment of a phase delay 500. The phase delay is a digital filter with the transfer function, $H_2(z)$, which is defined by Equation 2 and Table 2.

Phase delay 500 shifts each frequency component of the fundamental frequency, f, up to the 15th harmonic, 15f, by −90°, and because it is a realizable filter it has a finite time delay of 9 samples. This time delay is compensated for by having time delay 61 delay the current sample stream by an equal amount, i.e. giving time delay 61 a transfer function of $H(z)=z^{-9}$.

TABLE 2

$$H_2(z) = \sum_{i=-9}^{9} h_i * z^i \quad (2)$$

| Factor | Value |
|---|---|
| $h_{-9}$ | 0.100860 |
| $h_{-8}$ | 0.0 |
| $h_{-7}$ | 0.113500 |
| $h_{-6}$ | 0.08 |
| $h_{-5}$ | 0.141020 |
| $h_{-4}$ | 0.0 |
| $h_{-3}$ | 0.219143 |
| $h_{-2}$ | 0.0 |
| $h_{-1}$ | 0.639548 |
| $h_0$ | 0.0 |
| $h_1$ | −0.639548 |
| $h_2$ | 0.0 |
| $h_3$ | −0.219143 |
| $h_4$ | 0.0 |
| $h_5$ | −0.141020 |
| $h_6$ | 0.0 |
| $h_7$ | −0.113500 |
| $h_8$ | 0.0 |
| $h_9$ | −0.100860 |

Figure 13:
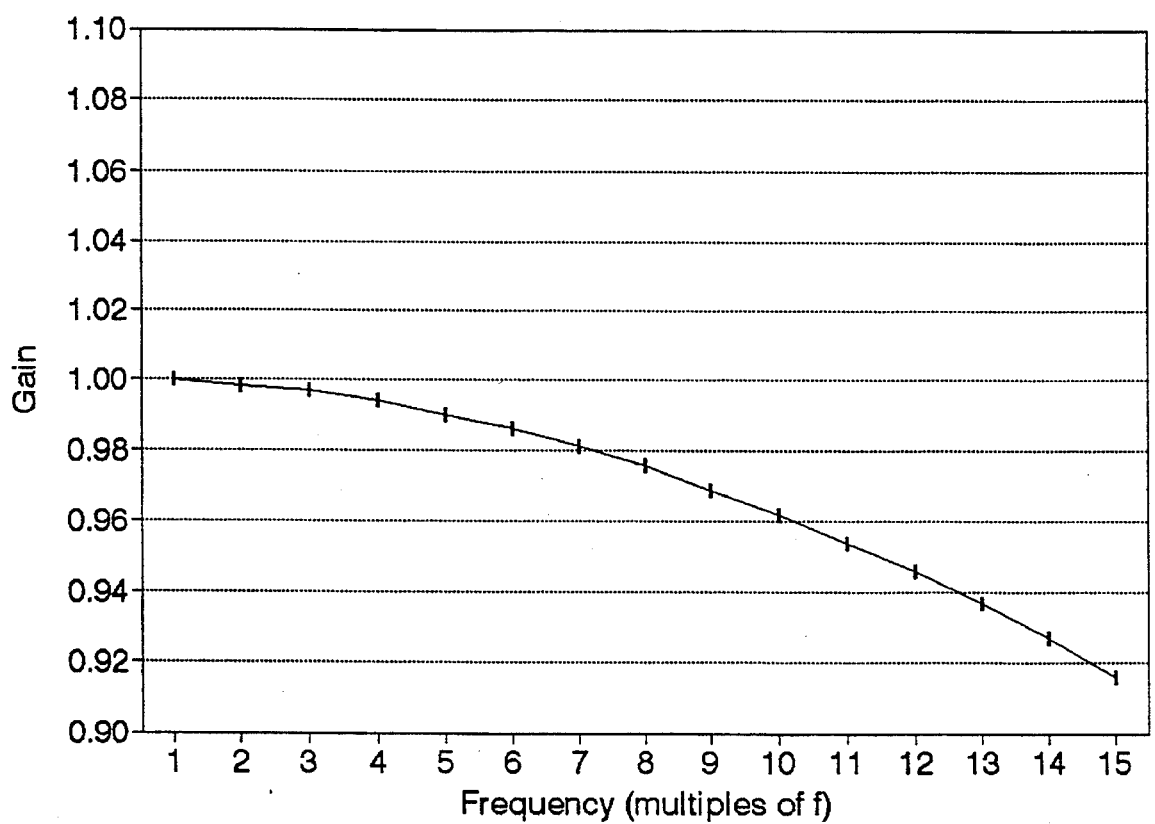
FIG. 13 is a graph of the combined gain of the sinc filters in a channel without compensation.

FIG. 13 is a graph of the combined gain of sinc filters 102 and 104 as a function of the frequency, without compensation. The frequency is expressed as a function of the fundamental frequency, f. The gain is expressed as a ratio of the gain at DC, i.e., gains are normalized to the DC gain. The same axes are also used in FIGS. 14–16. Note that the gain rolls off with frequency, as expected for sinc filters. This graph, if extended to 80f, would show its first zero there.

Figure 14:
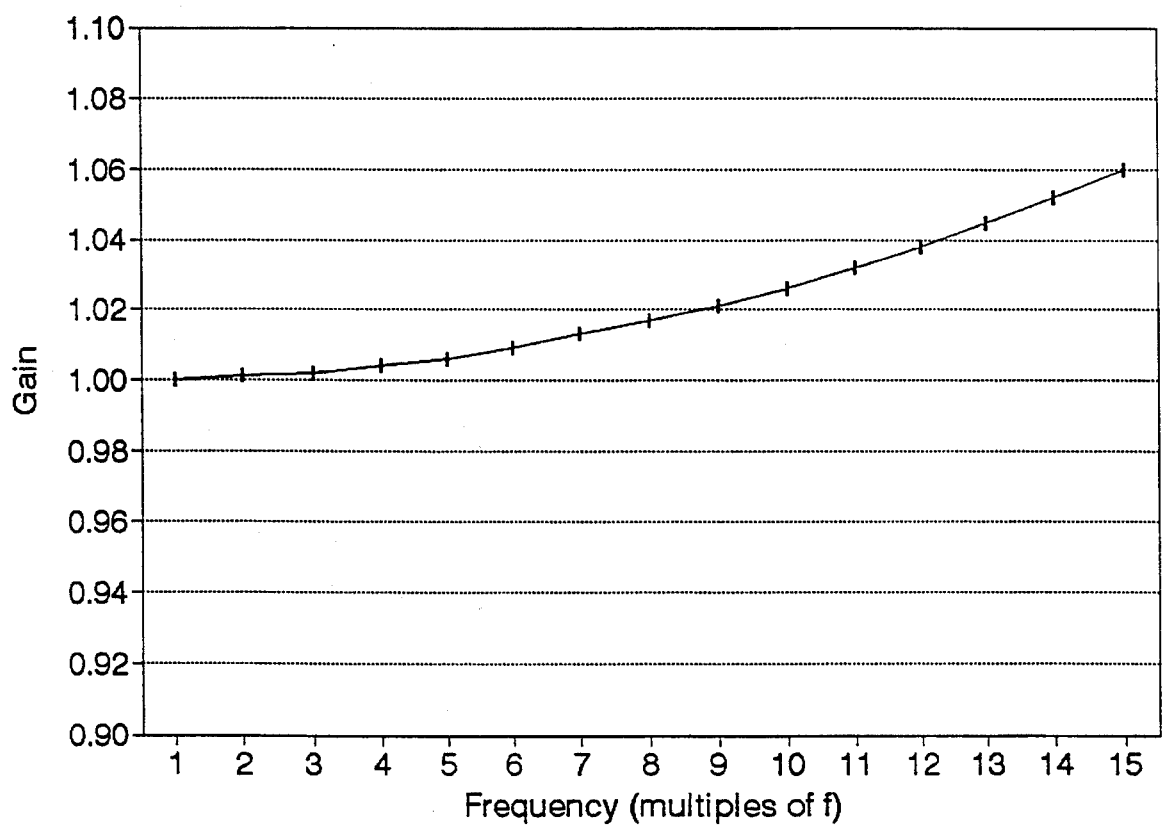
FIG. 14 is a graph of the combined gain of the current differentiator (the differentiating current sensor) and the digital integrator.

FIG. 14 is a graph of the overall gain of the current sensor differentiation, the half-sample delay, and the digital integrator. If an ideal integrator were used, the graph would be flat, but the digital integrator introduces the upward curve to about a 6% error at 15f. This error only occurs in the current channel 28, because voltage channel 26 does not have the differentiator/integrator pair.

Figure 15:
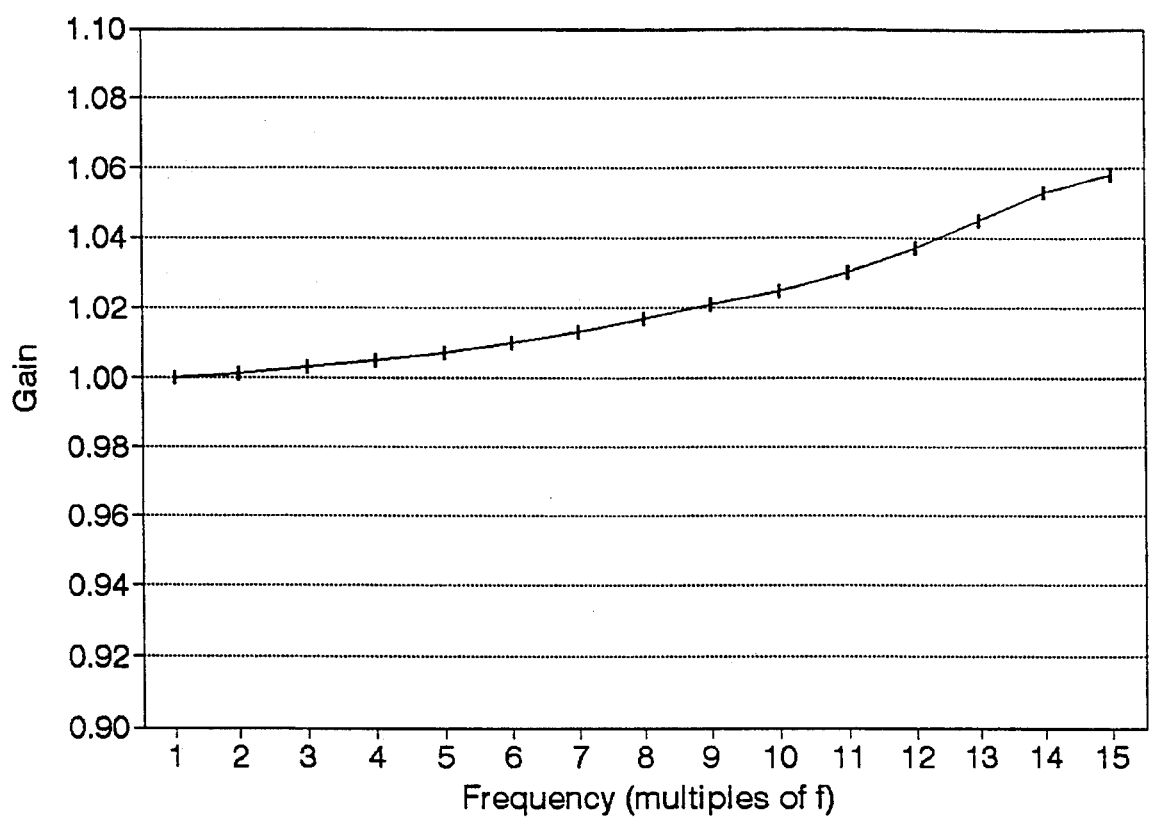
FIG. 15 is a graph of the gain of an IIR filter.

FIG. 15 is a graph of the gain of IIR filter 106. The gain of the IIR filter increases with frequency, and is selected for the effect shown in FIG. 16.

Figure 16:
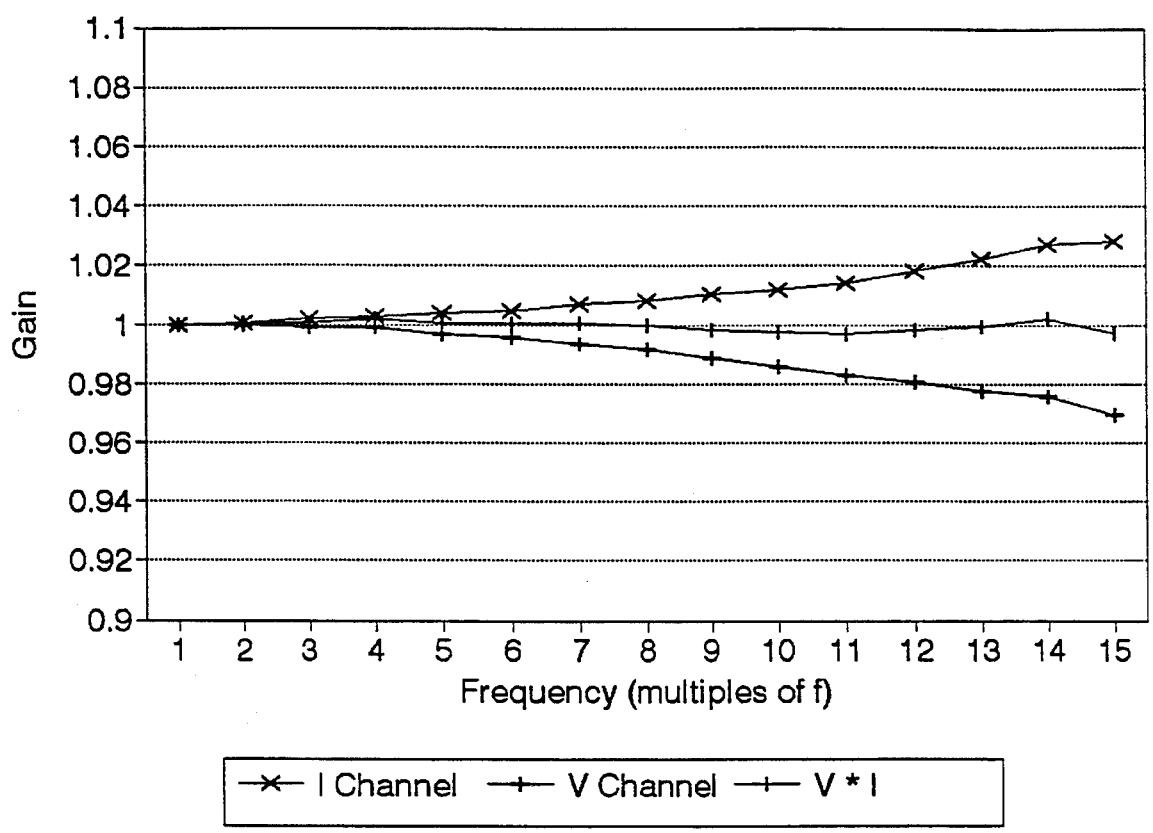
FIG. 16 is a graph of the overall gains of the voltage and current channels, and the gain of a multiplication of the current and voltage channels.

FIG. 16 is a graph of the overall gains of voltage channel 26 and current channel 28. The gain of voltage channel 26 is the gain of the sinc filters (FIG. 13) multiplied by the gain of the IIR filter (FIG. 15), which is shown in FIG. 16 by a curve which falls 3% from 0 to 15f. The gain of current channel 28 is the gain of the sinc filters (FIG. 13) multiplied by the gain of the current differentiator and integrator pair (FIG. 14) and the IIR filter (FIG. 15). The gain of the current channel is shown in FIG. 16 by a curve which rises 3% from 0 to 15f. The center curve of FIG. 16 is a power transfer function, which is the voltage and current transfer functions multiplied together. As FIG. 16 shows, this results in a fairly flat response out to 15f for power calculations.

The above description is illustrative and not restrictive. Many variations of the invention will become apparent to those of skill in the art upon review of this disclosure. Merely by way of example, the constants $K_{1-4}$ can be combined into one value; portions of the power meter shown as digital circuits can be implemented with analog circuits, with a digital computer, or with a combination of the three; random delays can be added to ensure accuracy; more than one digital processor can be used; current sensors measuring current directly instead of its derivative could be used; and other phase delays can be implemented to perform the same function as the phase delays shown in FIGS. 11 and 12.

The scope of the invention should, therefore, not be determined except as indicated by the appended claims along with their full scope of equivalents.

What is claimed is:

1. A power meter which outputs voltage and current samples at an output sample rate, where a voltage sample indicates a quantity of voltage across an electrical load at a sample time and a current sample indicates a quantity of current flowing through the electrical load at the sample time, the power meter comprising:

a voltage sensor, electromagnetically coupled to the electrical load, which outputs a voltage sensor signal representing the voltage across the electrical load;

voltage sampling means, coupled to receive said voltage sensor signal, for digitally sampling said voltage sensor signal and outputting a voltage waveform comprising digital samples at an input sample rate;

a voltage filtering path, coupled to receive said voltage waveform from said voltage sampling means, which outputs a filtered voltage waveform;

a current sensor electromagnetically coupled to the electrical load, which outputs a current sensor signal representing a derivative with respect to time of the current flowing through the electrical load;

a differential adder coupled at a first adder input to receive said current sensor signal, said differential adder outputting a signal at an adder output which is a difference of said current sensor signal and a signal applied to a second adder input of said differential adder;

current sampling means, coupled to said adder output, for digitally sampling said signal at said adder output at said input sample rate and outputting a time derivative current waveform comprising digital samples at said input sample rate;

a current feedforward filtering path, coupled to receive said time derivative current waveform, which outputs a filtered time derivative current waveform, wherein said current feedforward filtering path comprises filters with characteristics equal to filters in said voltage filtering path;

a current feedback signal path, coupled to receive said filtered time derivative current waveform from said current feedforward filtering path, which outputs a feedback signal to said second adder input of said differential adder, where said current feedback signal path comprises filters which cause the cancellation of direct-current (DC) components of said filtered time derivative current waveform;

a digital integrator, coupled to receive said filtered time derivative current waveform, which integrates said filtered time derivative current waveform and outputs, at the output sample rate, samples indicating an instantaneous value of the current flowing through the electrical load; and a delay means, clocked by an intermediate clock having a rate of at least twice the output sample rate, for delaying current samples in said current feedforward filtering path by a time equal to one-half a period of the output sample rate, thereby providing a substantially equal delay for samples through said current feedforward filtering path combined with said digital integrator and through said voltage filtering path.

2. The power meter of claim 1, wherein said current sampling means comprises a sigma-delta analog-to-digital converter which outputs a digitized representation of said adder output combined with quantization noise at said input sample rate.

3. The power meter of claim 1, wherein said current feedforward filtering path comprises:

a) a first third-order sinc filter, coupled at an output to an input of said delay means, where said first third-order sinc filter decimates an input waveform to an intermediate sample rate;

b) said delay means, coupled to an output of said first third-order sinc filter;

c) a first sinc filter, coupled to an output of said delay means, wherein said first sinc filter decimates current samples from said intermediate sample rate to the output sample rate; and d) a first IIR (infinite-impulse response) filter coupled to receive an output of said first sinc filter and to output said filtered time derivative current waveform, wherein said first IIR filter is characterized by a transfer function which compensates for at least a portion of a roll-off of said first third-order sinc filter and said first sinc filter;

and wherein said voltage filtering path comprises:

a) a second third-order sinc filter with filter characteristics equivalent to said first third-order sinc filter;

b) a second sinc filter, coupled to an output of said second third-order sinc filter, wherein said second sinc filter decimates voltage samples from said intermediate sample rate to the output sample rate and has filter characteristics equivalent to said first sinc filter; and d) a second IIR filter coupled to receive an output of said second sinc filter and to output said filtered voltage waveform, wherein said second IIR filter has filter characteristics equivalent to said first IIR filter.

4. The power meter of claim 1, further comprising an impulse noise bleeder around said digital integrator, for removing impulse noise from a quantity accumulated in said digital integrator 5. The power meter of claim 4, wherein said impulse noise bleeder is a first-order sinc filter with a decimation rate in the range of 20 to 200.

6. The power meter of claim 1, implemented by a suitably programmed digital signal processor, two analog-to-digital sampling circuits, and two digital-to-analog circuits.

7. The power meter of claim 1, further comprising digital processing means for generating output samples representative of electrical parameters of the electrical load including voltage squared, current squared, watts, volts-amps reactive, volt$^2$-hours, amp$^2$-hours, watt-hours, and VAR-hours.

8. A current meter which outputs samples at an output sample rate, where a sample indicates a quantity of current flowing through an electrical load at a sample time of the sample, the current meter comprising:

a current sensor electromagnetically coupled to the load, which outputs a sensor signal at a sensor output representing a derivative with respect to time of the current flowing through the load;

a differential adder coupled at a first adder input to said current sensor output, said differential adder outputting a signal at an adder output which is a difference of said sensor signal and a signal applied to a second adder input of said differential adder;

sampling means, coupled to said adder output, for digitally sampling said signal at said adder output and outputting a time derivative current waveform comprising digital samples at an input sample rate;

a feedforward filtering path, coupled to receive said time derivative current waveform, which outputs a filtered time derivative current waveform;

a feedback signal path, coupled to receive said filtered time derivative current waveform from said feedforward filtering path, which outputs an analog feedback signal to said second adder input of said differential adder where said feedback signal path comprises filters which cause the cancellation of direct-current (DC) components of said filtered time derivative current waveform; and a digital integrator, coupled to receive said filtered time derivative current waveform, which integrates said filtered time derivative current waveform and outputs, at the output sample rate, samples of instantaneous current in the load.

9. The current meter of claim 8, wherein said sampling means is a sigma-delta analog-to-digital converter which outputs a digitized representation of said adder output combined with quantization noise at said input sample rate, and said feedforward filtering path comprises decimating low pass filters, wherein said input sample rate is higher than the output sample rate.

10. The current meter of claim 9, wherein said decimating low pass filters are a third-order sinc filter and a first-order sinc filter, and wherein said feedforward filtering path also comprises an infinite impulse response filter.

11. The current meter of claim 10, wherein a half-sample delay is interposed between said third-order sinc filter and said first-order sinc filter, said half-sample delay introducing a delay equal to half a sample period of the output of the current meter.

12. The current meter of claim 8, wherein said feedback signal path comprises:

a second-order sinc filter, coupled to receive said filtered time derivative current waveform;

a decimator, coupled to an output of said second-order sinc filter;

a digital integrator, coupled to an output of said decimator;

a sigma-delta digital-to-analog converter, coupled at an input to an output of said decimator and coupled at an output to said second input of said differential adder.

13. The current meter of claim 8, further comprising an impulse noise bleeder around said digital integrator, for removing impulse noise from a quantity accumulated in said digital integrator.

14. The current meter of claim 13, wherein said impulse noise bleeder is a first-order sinc filter with a decimation rate in the range of 20 to 200.

15. The current meter of claim 8, implemented by a suitably programmed digital signal processor, an analog-to-digital sampling circuit, and a digital-to-analog circuit.

16. A method for providing a stream of digital samples representing electrical parameters in a load, including a parameter equal to a current flowing through the load, comprising the steps of:

measuring an analog signal representative of a derivative with respect to time of the current through the load;

subtracting a DC cancellation signal from said analog signal to form a relative analog signal;

sampling said relative analog signal at an input sampling rate to form a current waveform comprising digital samples;

digitally filtering said current waveform to form a filtered current waveform;

generating said DC cancellation signal from said filtered current waveform;

digitally integrating said filtered current waveform; and outputting an integrated current waveform as a waveform representative of instantaneous current through the load, said integrated current waveform comprising digital samples output at an output sample rate.

17. The method of claim 16, further comprising the step of removing accumulations in said step of digitally integrating over a plurality of cycles of integration.

18. The method of claim 16, wherein the electrical parameters include a voltage across the load, the method further comprising the steps of:

measuring an analog voltage signal representative of the voltage across the load;

sampling said analog voltage signal at the input sampling rate to form a voltage waveform comprising digital samples;

digitally filtering said voltage waveform to form a filtered voltage waveform, using filters matched to filters used in said step of digitally filtering said current waveform;

filtering said filtered voltage waveform to remove DC components;

delaying said current waveform by a time equal to half of a period between two samples at said output sample rate; and outputting said filtered voltage waveform as a waveform representative of instantaneous voltage across the load, said filtered voltage waveform comprising digital samples output at said output sample rate.

19. The method of claim 18, wherein said steps of digitally filtering said current waveform and digitally filtering said voltage waveform each include a step of filtering, with similar filters, said current and voltage waveforms to partially compensate for a transfer function differential between said current waveform and said voltage waveform to provide a more even transfer function in a frequency range of interest for a power signal.

20. The method of claim 18, further comprising the steps of calculating electrical parameters of the load from said filtered voltage samples and said filtered current samples including voltage squared, current squared, watts, volt-amps reactive (VAR), $volt^2$-hours, $amp^2$-hours, watt-hours, and VAR-hours.

* * * * *